INTEGRATED SWITCHING MATRIX COMPRISING FIELD-EFFECT DEVICES
Filed Jan. 17, 1966 2 Sheets-Sheet 1
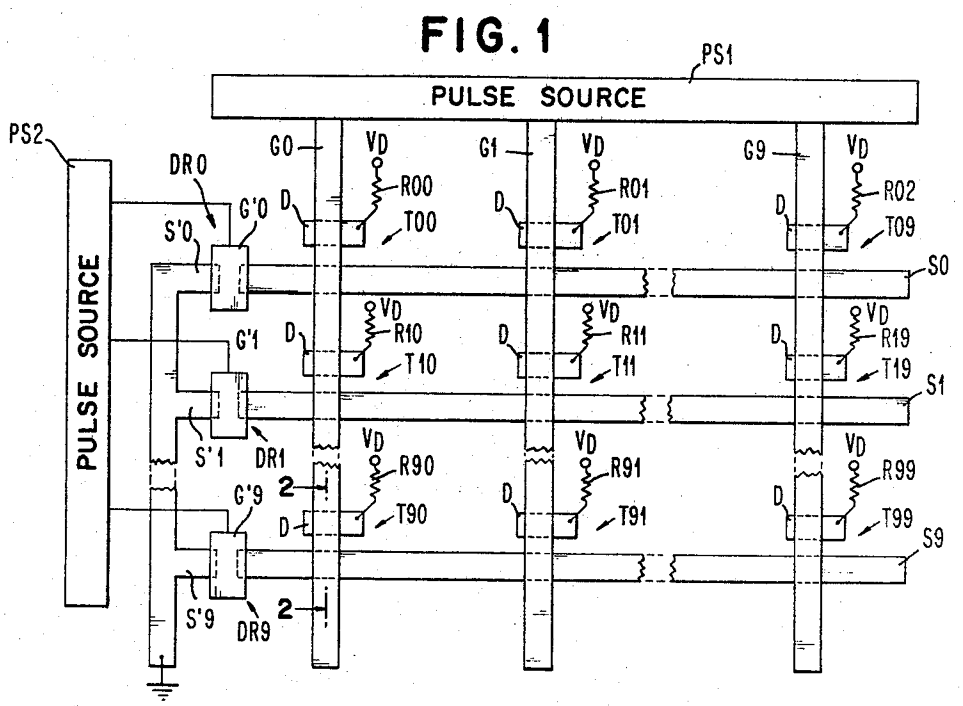
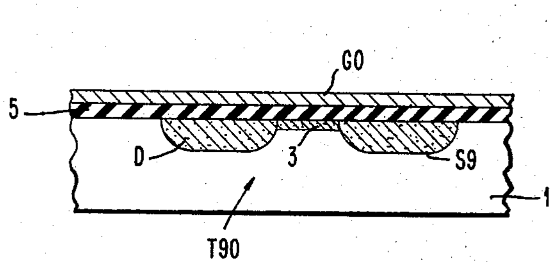
FIG. 2
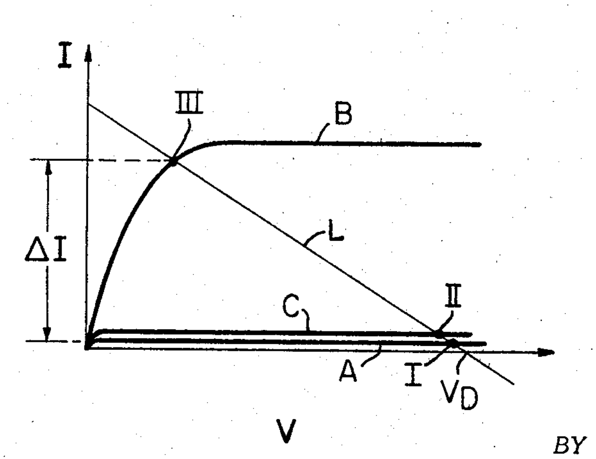
FIG. 3
INVENTOR.
HWA N. YU
BY S. P. Tedesco
ATTORNEY Feb. 3, 1970 HWA N. YU 3,493,932

INTEGRATED SWITCHING MATRIX COMPRISING FIELD-EFFECT DEVICES

Filed Jan. 17, 1966 2 Sheets-Sheet 2

3,493,932
INTEGRATED SWITCHING MATRIX COMPRISING FIELD-EFFECT DEVICES

Hwa N. Yu, Yorktown Heights, N.Y., assignor to International Business Machines Corporation, Armonk, N.Y., a corporation of New York Filed Jan. 17, 1966, Ser. No. 521,072
Int. Cl. H04q *1/00, 3/00*; G06f *7/38*
U.S. Cl. 340—166 9 Claims

ABSTRACT OF THE DISCLOSURE

An integrated two-dimensional matrix array wherein individual switching elements are field-effect devices. The switching elements in each row have a common electrode while those in each column also have a common electrode. These common electrodes define the two-dimensions of the array. Coincident energization of the common electrodes establishes conduction in a selected element. Driver circuit arrangements use the same type of field-effect devices and have electrodes which are also common with an electrode of the switching elements.

This invention relates to matrix switching networks comprising an array of solid-state electronic devices and adaptable to batch-fabrication techniques. More particularly, this invention is directed to a matrix array wherein the individual switching elements are formed of solid-state electronic devices exhibiting amplification.

Various arrangements are known in the prior art wherein the energization of a particular combination of input signal leads is effective to selectively energize a particular one of a plurality of output signal leads. Such arrangements are generally referred to as switching matrices and generally include a number of switching elements each responsive to the coincident energization of a connected pair of signal input leads and, in turn, operative to energize a corresponding output signal lead. With the advent of increased and widespread use of computer and data processing systems, the need for reliable and efficient switching matrices is becoming more pronounced. Due to the increased complexity of such systems, such need comprehends switching matrices of large density and submicrominiature dimensions. At the present time, industry is meeting such need by the development of batch-fabrication techniques whereby arrangements of solid-state electronic devices along with functional interconnections are formed on a single semiconductor wafer. The objective of such development is to reduce the size, weight, and unit cost of the individual electronic devices and, also, to improve speed, reliability, and power utilization while minimizing packaging requirements from the system viewpoint.

Numerous solid-state electronic devices adaptable to batch-fabrication have been described in the patent and scientific literature. Particular ones of such devices can be classified as "field-effect" devices, i.e., a structure including a semiconductor current path, or conduction channel, interconnecting source and drain electrodes and whose conductivity is electric field-modulated. Examples of "field-effect" devices are the insulated-gate (MOS) field-effect transistor; the thin film (TFT) field-effect transistor; and, the unipolar field-effect transistor. Reference is made to Field-Effect Transistors, by L. J. Sevin, Jr., McGraw-Hill Book Company, 1965, wherein such devices are discussed. "Field-effect" devices are adapted to batch-fabrication by processes which are relatively simple as compared to processes for forming other solid-state electronic devices, e.g., the bipolar transistor, etc. For example, any number of insulated-gate (MOS) field-effect transistor structures can be formed in a semiconductor wafer by a single diffusion process wherein source and drain diffusions, or electrodes, are defined. The individual structures are completed by photolithographic techniques whereby an insulated-gate metalization is formed over the narrow surface portion of the semiconductor wafer intermediate the corresponding source and drain diffusion. Also, functional interconnections between the individual structures are formed concurrently with the gate metalization. By present day techniques, large numbers of "field-effect" devices, i.e., in excess of 1000, can be formed along with functional interconnections on a single semiconductor wafer having a diameter of approximately 1 inch.

In operation, a "field-effect" device closely approximates a vacuum tube pentode since it is a voltage-controlled device and conduction is supported only by majority carriers. Also, an additional similarity exists in that a "field-effect" device is operative as an amplifier with respect to the input signal applied at the gate metalization. Since such devices are voltage-controlled and have a high input impedance, driving power for such devices is minimal. Accordingly, the ability to form a practical and useful switching matrix of such "field-effect" devices in sub-microminiature dimensions and having inherent amplification would provide a highly useful arrangement.

Accordingly, an object of this invention is to provide a novel and improved switching matrix employing "field-effect" devices as switching elements.

Another object of this invention is to provide a novel switching matrix formed of solid-state electronic devices and which is adapted to batch-fabrication.

Another object of this invention is to provide a high-density, compact, and efficient switching matrix.

Another object of this invention is to provide an efficient switching matrix comprising solid-state electronic devices exhibiting amplfication.

Another object of this invention is to provide a novel switching matrix, such matrix along with necessary driver circuits and functional interconnections being batch-fabricated on a single semiconductor wafer.

In accordance with the particular aspects of this invention, the switching matrix array comprises a plurality of "field-effect" devices arranged in two-dimensional fashion so as to allow coincident selection. In accordance with a preferred embodiment of this invention, a plurality of insulated-gate field effect transistors are formed in a single semiconductor wafer in two-dimensional fashion, e.g., in distinct rows and columns. "Field-effect" transistors in a same row are defined by a common source diffusion to establish a first dimension in the matrix array; also, a common insulated-gate metalization is provided for corresponding "field-effect" transistors in a distinct row to establish a second dimension in the matrix array. The "field-effect" transistors are given singularity, or identity, by individual drain diffusions spaced along the common source diffusions and connected to a load. Each common gate metalization is in electric field-applying relationship to the respective conduction channels of corresponding "field-effect" transistors in the distinct rows of the matrix array. Accordingly, coincident energization of a selected common gate metalization and selected common source diffusion supports source-drain current $I_{sd}$ in a selected "field-effect" transistor whereby a load connected at the drain diffusion is energized. Energization of either a common gate metalization or a common source diffusion defining other "field-effect" transistors is not sufficient to support source-drain current $I_{sd}$ therein.

Also, in accordance with other aspects of this invention, driver circuit arrangements comprise same-type "field-effect" transistors and are formed concurrently with the switching matrix. In the preferred embodiment, each driver circuit comprises an insulated-gate field-effect transistor which utilizes a corresponding common source diffusion as a "drain electrode." In effect, a driver "field-effect" transistor is arranged in series with each of the switching "field-effect" transistors in a corresponding row of the switching matrix. When a driver "field-effect" transistor is disabled, switching "field-effect" transistors in a corresponding row are substantially unaffected by energization of the common gate metalizations due to the large degenerate feedback introduced in the common source circuit.

The foregoing and other objects, features and advantages of the invention will be apparent from the following more particular description of preferred embodiments of the invention, as illustrated in the accompanying drawings.

In the drawings:

FIG. 1 is a schematic representation of a 10 x 10 switching matrix in accordance with this invention and comprising insulated-gate field effect transistors.

FIG. 2 is a cross-sectional view of an insulated-gate field-effect transistor transistor taken along line 2—2 of FIG. 1.

FIG. 3 illustrates current-voltage characteristic curves of a series arrangement of a switching "field-effect" transistor and a driver "field-effect" transistor which are useful in understanding the operation of the switching matrix of FIG. 1.

Figure 4:
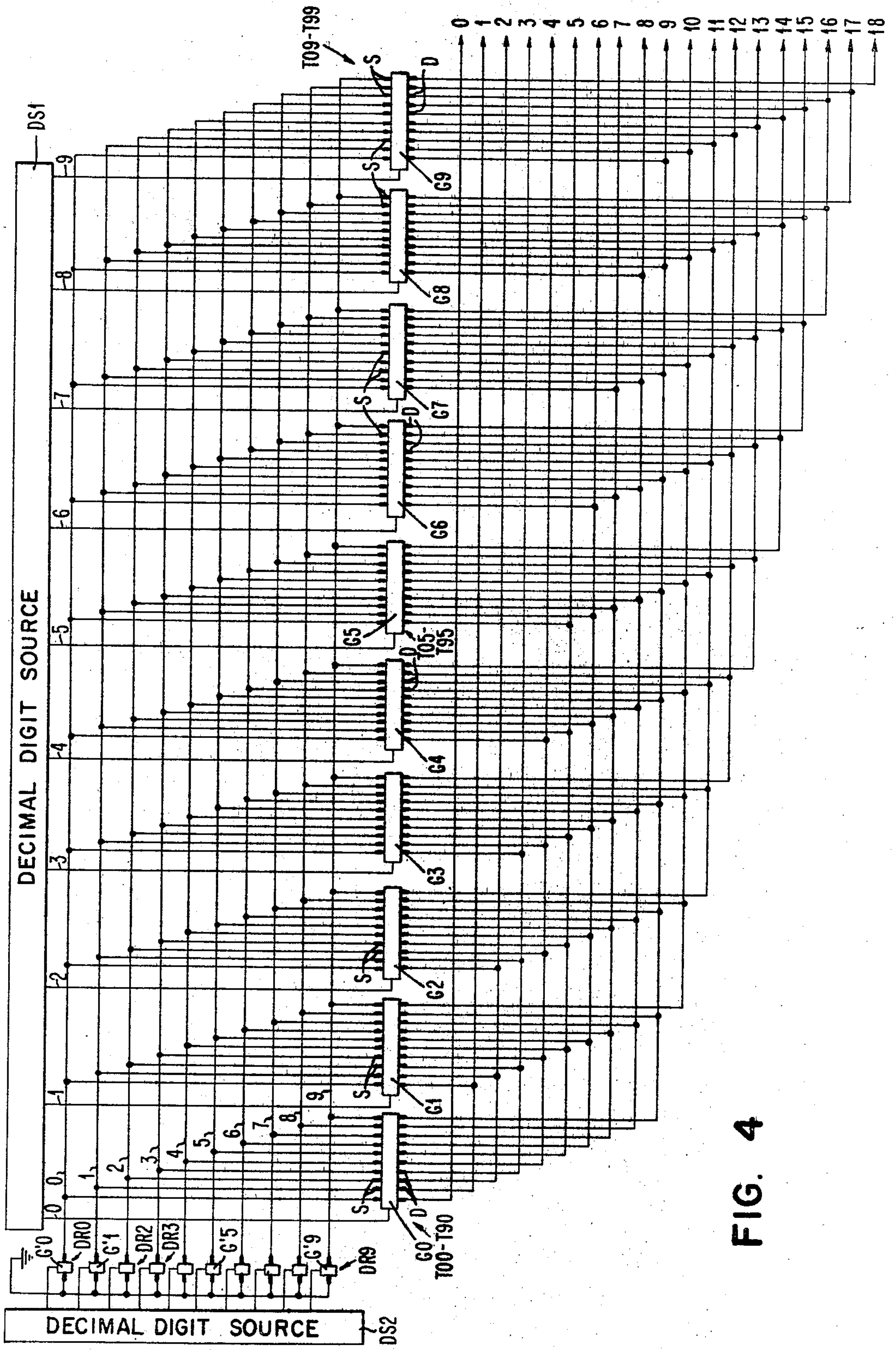
FIG. 4 is a schematic representation of a decimal half-adder in accordance with this invention.

As shown in FIGS. 1 and 2, a switching matrix in accordance with this invention comprises a plurality of switching "field-effect" transistors T00–T99 of the insulated-gate type which are adapted to drive loads R00–R99, respectively, in response to the coincident operation of pulse sources PS1 and PS2. From the description hereinafter set forth, it will be evident that "field-effect" transistors either of the thin film or unipolar type may be utilized in the switching matrix.

The switching matrix is formed on the surface of a relatively high resistivity semiconductor wafer 1, e.g., formed of P-type silicon (Si). One dimension in the switching matrix is defined by elongated source diffusions S0–S9 of N-type conductivity defined in parallel-aligned fashion on wafer 1. Each of the source diffusion S0–S9 defines a common source "electrode" of a plurality of switching transistors in a row of the switching matrix. A plurality of drain diffusions D are formed on wafer 1 in spaced-parallel fashion with each of source diffusions S0–S9, e.g., approximately 50 microns. The narrow surface portion 3 of wafer 1 (cf. FIG. 2) intermediate each drain diffusion D and a corresponding source diffusion defines the conduction channel 3 of an individual switching transistor. Also, a plurality of gate metalizations G0–G9 are formed in insulated-fashion over wafer 1 and transverse to source diffusions S0–S9 to define a second dimension in the switching matrix. Gate metalizations G0–G9, when energized, apply transverse electric fields at the surface of conduction channel 3 of switching transistors in a particular column of the switching matrix. Normally, a thin insulating layer 5 (cf. FIG. 2) is formed over the surface of wafer 1 to insulate gate metalizations G0–G9.

Accordingly, an insulated-gate "field-effect" transistor is defined by individual drain diffusions D at each cross-over of source diffusions S0–S9 and gate metalizations G0–G9. In addition, loads R00–R99 are individually connected to drain diffusions D of switching elements T00–T99, respectively. Voltage source $V_D$ is connected at the other terminal of loads R00–R99 and supplies biasing voltages to the associated drain diffusions D.

Gate metalizations G0–G9 are connected to a pulse source PS1 of conventional type and operative to selectively bias the gate metalizations. Also, source diffusions S0–S9 are connected to driver transistors DR0–DR9, respectively. As shown, driver transistors DR0–DR9 are insulated-gate field-effect transistors, source diffusions S0–S9, respectively being utilized as "drain electrodes." Driver transistors DR0–DR9 are defined by source diffusions S'0–S'9 spaced from one end of source diffusions S0–S9, respectively; source diffusions S'0–S'9 are commoned and returned to a fixed potential, e.g., ground. Spacings between source diffusions S'1–S'9 are source diffusions S0–S9, respectively, defined conduction channels 3 for driver transistors DR0–DR9, respectively. Gate metalizations G'0–G'9 are formed in insulated-fashion over conduction channels 3 of driver transistors DR0–DR9, respectively, and connected to pulse source PS2. Pulse source PS2 may be of conventional type and operative to selectively bias gate metalizations G'0–G'9. When the corresponding gate metalization is biased, driver transistors DR0–DR9 are enabled, i.e., conductive, and provide a relatively low impedance path between source diffusions S0–S9, respectively, and ground. In effect, each driver transistor DR0–DR9 is in series with switching transistors defined by source diffusions S0–S9, respectively. Driver transistors DR0–DR9, when disabled, introduce large degenerate feedback in the common circuit of switching transistors defined by source diffusions S0–S9, respectively, to inhibit source-drain current $I_{sd}$ therein when gate metalizations G0–G9 are energized.

The fabrication of the switching matrix of FIG. 1 can best be understood by reference to FIG. 2 which is illustrative of the respective structures of switching transistors T00–T99 and, also, driver transistors DR0–DR9. As hereinabove indicated, the complete switching matrix of FIG. 1 including the driver transistors DR0–DR9, except for pulse sourses PS1 and PS2, can be fabricated concurrently on a single P-type silicon (Si) wafer 1. Source diffusions S0–S9 and S'0–S'9 and each of the drain diffusions D are formed by conventional diffusion processes whereas gate metalizations G0–G9 and G'0–G'9 are formed by conventional thin film metalization techniques. For example, insulating layer 5, e.g., of silicon dioxide ($SiO_2$), is initially formed over the surface of wafer 1; insulating layer 5 may be used both for masking purposes during diffusion processes and, also, to electrically insulate wafer 1 and thin metallic film patterns defining functional interconnections and, also, gate metalizations. Insulating layer 5 can be formed genetically by exposing the surface of wafer 1 at approximately 1250° C. to an atmosphere of either oxygen ($O_2$) or oxygen and water vapor ($O_2+H_2O$) for a time sufficient to be formed in a thickness of approximately 5000 A. When formed, a pattern of "diffusion windows" are opened in insulating layer 5 by conventional photolithographic techniques to expose surface portions of wafer 1 wherein source diffusions S0–S9 and S'0–S'9, respectively, and, also, drain diffusions D are to be defined. With insulating layer 5 acting as a diffusion mask, wafer 1 is heated at temperatures ranging between 1100° C. and 1250° C. in the presence of, for example, phosphorus pentoxide ($P_2O_5$), to form the particular patterns of N-type diffused regions. Subsequently, wafer 1 is exposed to a reoxidation process to form insulating layer 5 within the "diffusion windows" and over the N-type diffused regions in wafer 1. Subsequently, thin film metalization techniques are employed to define the gate metalizations G0–G9 and G'0–G'9 and, also, necessary functional interconnections; access to particular N-type diffusions, e.g., drain diffusions D, is had by opening "access windows" in insulating layer 5 by conventional photolithographic techniques. Such metalization techniques include the initial formation of a thin metallic film, e.g., of aluminum (Al), and the use of photoresist processes to define particular metalization patterns. A process for forming insulating-gate field-effect transistors exhibiting enhancement mode operation is more particularly set forth in the copending G.

Cheroff et al. patent application Ser. No. 468,481, filed on June 30, 1965 and assigned to a common assignee.

As illustrated in FIG. 2, wafer 1 forms a constituent part of the individual transistor structures and, also, provides support for the total switching matrix. For example, as shown, narrow surface portion of wafer 1 between source diffusion S9 and drain diffusion D defines conduction channel 3 of switching transistor T90. As the switching element T90 exhibits enhancement mode operation, substantially no source-drain current $I_{sd}$ flows along conduction channel 3 at zero gate bias, i.e., $V_g=0$ volts. Conduction in a "field-effect" transistor structure is primarily a surface mechanism wherein the density of mobile majority carriers along conduction channel 3 is modulated by transverse electric fields. When gate metalization G0 is biased, e.g., $V_g=5$ volts, majority carriers attracted into and invert the narrow surface portion of wafer 1 defining conduction channel 3 whereby source-drain current $I_{sd}$ flows between source and drain electrodes S9 and D.

The operation of the switching matrix of FIG. 1 is further described with respect to FIG. 3 wherein individual curves indicate the current-voltage characteristics of a series arrangement including a switching transistor and a driver transistor. When driver transistors DR0–DR9 are disabled, selective energization of gate metalizations G0–G9 is ineffective to support source-drain current $I_{sd}$ along any of the switching transistors defined thereby and source diffusions S0–S9, respectively. Also, when gate metalizations G0–G9 are unbiased, the selective enablement of driver transistors DR0–DR9 is likewise ineffective. For example, as in FIG. 3, the operation of each series arrangement including a switching transistor with a corresponding driver transistor is described by load line L. During quiescent operation, i.e., driver transistors DR0–DR9 disabled and gate metalizations G0–G9 unbiased, the operation of each series arrangement is described by curve A at intersection I with load line L. When a selected one of driver transistors DR0–DR9 is enabled or a selected one of gate metalizations G0–G9 is energized, the operation of each series arrangement defined thereby is describable by curves B and C. Curve B indicates the case of a series arrangement wherein the gate metalization of the switching transistor is biased, e.g., $V_{gs}=5$ volts, and the driver transistor is enabled. If a particular gate metalization G0–G9 is singularly energized, i.e., $V_{gs}=5$ volts, the operation of each corresponding series arrangement is described by curve C at intersection II with load line L; conduction along such switching arrangements is substantially undisturbed because of the large degenerate feedback due to disabled driver transistors DR0–DR9, respectively. Again, when a selected driver transistor DR0–DR9 is singularly enabled to establish the common sourcve diffusion at substantially ground potential, the operation of each corresponding series arrangement is essentially undisturbed from intersection II. A significant change in conduction Δ I along a selected series arrangement including switching transistors T00–T99, respectively, is only achieved when the corresponding driver transistor DR0–DR9 is enabled and the corresponding gate metalization G0–G9 is coincidently energized. At such time, the operation of the series arrangement is described by curve B at intersection III with load line L. For example, consider that load R90 connected at drain diffusion D of switching transistor T90 is to be energized. Accordingly, pulse source PS2 biases gate metalization G'9, i.e., $V_{gs}=5$ volts, so as to invert conduction channel 3 of driver transistor DR9 and establish source diffusion S9 at substantially ground potential. Coincidently, pulse source PS1 biases gate metalization G0, i.e., $V_{gs}=5$ volts. Accordingly, only the series arrangement including switching transistor T90 is described at point III on curve B whereby load R90 is energized. The current path can be traced from voltage source $V_D$ and through load R90, drain diffusion D and conduction channel 3 of switching transistor T90, source diffusion S9, and along conduction channel 3 and source diffusion S'9 of driver DR9 to ground. At this time, the operation of series arrangements including switching transistors T00–T80 defined by gate metalization G0 and, also, series arrangements including switching transistors T91–T99 defined by source diffusion S9 is described at intersection II on curve C, as hereinabove described. The operation of series arrangements including each of the remaining switching transsitors is described at intersection I on curve A.

In FIG. 4, a decimal half-adder in accordance with this invention is illustrated wherein complete functional interconnections are schematically illustrated. In FIG. 4, switching transistors T00–T99 and driver transistors DR0–DR9 are individually defined by spaced N-type source diffusion S and drain diffusion D in water 1. Conduction channels 3 of switching transistors in groups T00–T09, T10–T19 . . . T90–T99 are aligned, as shown, and common insulated-gate metalizations G0–G9, respectively, are formed thereover. Source diffusions defining corresponding switching transistors in groups T00–T90, T10–T19 . . . T09–T99 are multipled along "crossunder" conductors 0–9 and connected to drain diffusions D of driver transistors DR0–DR9, respectively. Source diffusions S of driver transistors DR0–DR9 are multipled to ground. "Crossunder" conductors 0–9 each correspond to a particular decimal digit and establish one dimension in the switching matrix as did source diffusions S0–S9 of FIG. 1. Gate metalizations G'0–G'9 of driver transistors DR0–DR9, respectively, are connected to a decimal digit source DS2. Drain diffusions D of switching transistors T00–T99 are connected to a number of "crossunder" conductors 9–18 which define signal output leads and are connected to an appropriate load including voltage source $V_D$, not shown. Also, common gate metalizations G0–G9, each corresponding to a particular decimal digit, are connected to a decimal digit source PS2 and establish a second dimension in the switching matrix.

In operation, digit source DS2 energizes a selected gate metalization G'0–G'9 to enable driver transistors DR0–DR9, respectively, corresponding to a first decimal digit to be added whereby the corresponding "crossunder" conductor 0–9, respectively, is established substantially at ground potential. Coincidently, digit source DS1 energizes a selected metalization G0–G9 corresponding to a second decimal digit to be added. Accordingly, conduction is achieved along only that series arrangement including the switching transistor defined by the selected common gate metalization and corresponding to the selected driver element, as hereinabove described, whereby a selected "crossunder" conductor 0–18 corresponding to the decimal "sum" is energized.

The decimal half-adder of FIG. 4 can be formed by conventional techniques. For example, source and drain diffusions S and D of switching transistors T00–T99 and, also, of driver transistors DR0–DR9 being formed during a first diffusion process, as hereinabove described. Subsequently, "crossunder" conductors 0–9 and, also, 0–18 can be defined by thin metallic patterns formed over insulating layer 5 (cf. FIG. 2) or, alternatively, by N+ diffusion patterns in the surface of wafer 1 during a second diffusion process. For example, if "crossunder" conductors 0–9 and, also, 0–18 are diffused, reoxidation of wafer 1, as hereinabove described, forms a continuous insulating layer 5 over source and drain diffusion and, also, "crossunder" diffusion patterns. Subsequently, vertical interconnections, not identified, between source and drain diffusions S and D of switching transistors T00–T99 and selected "crossunder" diffusions 0–9 and, also, 0–18 are formed simultaneously with gate metalizations G0–G9 by conventional photolithographic processes, as hereinabove described.

The switching matrix of FIG. 1 can be adapted to control the flow of either small signal information or large signal data pulses applied along any one of a group of output channels represented by loads R00–R99, respectively. Selection of a particular group of loads R00–R90, R01–R91 . . . R09–R99 is determined by the selective energization of a gate metalization G0–G9, respectively, whereas the particular loads in the selected group are determined by the energization of selected driver transistors DR0–DR9, respectively, by pulse source PS2. Since switching devices T00–T99 are essentially connected in a common source configuration, the signal coupled to the particular loads is amplified.

What is claimed is:

1. A decimal adder, comprising, in combination, a plurality of field-effect devices arranged an array, each of said devices including source and drain electrodes conductively coupled along a semiconductor conduction channel and a gate electrode associated with said conduction channel, a plurality of first signal means each representative of a first decimal quantity and connected to gate electrodes of selected groups of said devices, said gate electrodes being common to a plurality of said devices and extending in a first direction, said first signal means being connected to each of said gate electrodes by conductors which extend in a second direction, said first and second directions defining a two dimensional array, a plurality of second signals means each representative of a second decimal quantity and connected to source electrodes of corresponding devices in each of said selected groups, said devices being representative of the decimal sum of said first and second decimal digits as represented by said first and said second means connected at the respective gate and source electrodes, a plurality of signal output means each representative of a particular decimal sum, and means interconnecting said signal output means and drain electrodes of said devices representative of a same decimal sum.

2. A switching matrix comprising:
- an array of first field-effect devices each having source and drain electrodes conductively connected by an active semiconductor layer and a gate electrode associated with said active layer;
- said source electrodes being arranged in rows which extend in a first direction across said matrix, each source electrodes being associated with a plurality of said devices;
- said gate electrodes being arranged in columns which extend in a second direction across said matrix, each gate electrode being associated with a plurality of said devices;
- output means connected to said drain electrodes of said first devices;
- first means connected to said source electrodes and second means connected to said gate electrodes, said first and second means being coincidentally operative to produce conduction along the active layer in a selected one of said first devices.

3. The matrix of claim 2, wherein said first means includes a plurality of second field-effect devices, each of which is in series with those first devices which extend along said first direction, each of said second field-effect devices having drain electrodes which are integral with a source electrodes associated with a row of said first field-effect devices.

4. The switching matrix of claim 3, wherein said first and second devices are of the same type.

5. The matrix of claim 2, wherein said first and second directions are normal to each other.

6. A switching matrix comprising:
- an array of first field-effect devices, each having source and drain electrodes connected by an active semiconductor layer and a gate electrode associated with said active layer;
- said source electrodes being multipled to define a first dimension in said array and said gate electrodes being multipled to define a second dimension in said array, said second dimension being at an angle with respect to said first dimension, each said drain electrode being individual to a single field-effect device and separate from said source electrodes;
- output means connected to said drain electrodes of said first devices;
- first means connected to said source electrodes and second means connected to said gate electrodes, said first and second means being coincidentally operative to produce conduction along the active layer in a selected one of said first devices.

7. The switching matrix of claim 6, wherein said angle is substantially 90°.

8. The switching matrix of claim 6, wherein said array of first devices is formed on a semiconductor wafer of first conductivity type, said multipled source electrodes being defined by elongated diffusion patterns of opposite conductivity type in said wafer, said drain electrodes being defined by individual diffusion patterns of opposite conductivity in said wafer and spaced along said elongated diffusion patterns, whereby individual groups of said first devices are defined.

9. The switching matrix of claim 6, wherein said first means includes a plurality of second field-effect devices which are in series with those first devices which extend along said first dimension, said second field-effect devices having drain electrodes which are integral with source electrodes of said first field-effect devices and source electrodes which are individual to each of said second field-effect devices and separate from the source electrodes of said first field-effect devices.

References Cited

UNITED STATES PATENTS

| | | | |
|---|---|---|---|
| 3,252,003 | 5/1966 | Schmidt | 307—304 |
| 3,109,942 | 11/1963 | Luscher | 307—304 X |
| 3,275,996 | 9/1966 | Burns | 307—304 X |
| 3,355,598 | 11/1967 | Tuska | 307—304 |

HAROLD I. PITTS, Primary Examiner

U.S. Cl. X.R.

235—168; 307—304; 340—167, 147